(12) United States Patent
Li (10) Patent No.: US 11,948,037 B2
(45) Date of Patent: Apr. 2, 2024

(54) CONTACTLESS CARD MANUFACTURING APPARATUS AND CONTACTLESS CARD MANUFACTURING METHOD

(71) Applicant: SHANGHAI ORIENTAL MAGNETIC CARD ENGINEERING CO., LTD., Shanghai (CN)

(72) Inventor: Xiaodong Li, Shanghai (CN)

(73) Assignee: SHANGHAI ORIENTAL MAGNETIC CARD ENGINEERING CO., LTD., Shanghai (CN)

( * ) Notice: Subject to any disclaimer, the term of this patent is extended or adjusted under 35 U.S.C. 154(b) by 307 days.

(21) Appl. No.: 17/425,775

(22) PCT Filed: Jan. 21, 2020

(86) PCT No.: PCT/CN2020/073449
§ 371 (c)(1),
(2) Date: Jul. 26, 2021

(87) PCT Pub. No.: WO2020/156373
PCT Pub. Date: Aug. 6, 2020

(65) Prior Publication Data
US 2022/0188591 A1 Jun. 16, 2022

(30) Foreign Application Priority Data
Jan. 28, 2019 (CN) .......................... 201910082321.3

(51) Int. Cl.
*G06K 19/06* (2006.01)
*B23K 1/00* (2006.01)
(Continued)

(52) U.S. Cl.
CPC ...... *G06K 19/07758* (2013.01); *B23K 1/0016* (2013.01); *B23K 3/087* (2013.01); *G06K 19/07773* (2013.01); *B23K 2101/36* (2018.08)

(58) Field of Classification Search
CPC ......... G06K 19/07749; G06K 19/0775; G06K 19/07747; G06K 19/07; G06K 19/07775;
(Continued)

(56) References Cited

U.S. PATENT DOCUMENTS 7,845,541 B1 * 12/2010 Chen .................... B23K 3/0638
228/43
2002/0099473 A1 7/2002 Amadeo et al.
(Continued)

FOREIGN PATENT DOCUMENTS

| CN | 1412698 A | 4/2003 |
| CN | 203209971 U | 9/2013 |

(Continued)

OTHER PUBLICATIONS

International Search Report regarding International Application No. PCT/CN2020/073449, dated Apr. 8, 2020.
(Continued)

*Primary Examiner* — Daniel St Cyr
(74) *Attorney, Agent, or Firm* — Harness, Dickey & Pierce, P.L.C.

(57) ABSTRACT

Disclosed are a contactless card manufacturing apparatus and a contactless card manufacturing method. The contactless card manufacturing apparatus comprises: an antenna implantation device, wherein the antenna implantation device is used for implanting a copper wire into a card manufacturing base material; a chip fixing device, wherein the chip fixing device is used for placing a chip at a fixed position on the card manufacturing base material; a pin welding device, wherein the pin welding device is used for respectively welding two ends of a wire to a pin of the chip and to the copper wire; and a transmission device, wherein the transmission device is used for transmitting the card manufacturing base material between the antenna implan- (Continued)

tation device, the chip fixing device and the pin welding device. According to the contactless card manufacturing apparatus and the contactless card manufacturing method, by means of the transmission device transmitting the card manufacturing base material, the card manufacturing base material is transmitted between the devices corresponding to various processing links, and with the card manufacturing base material as a reference, a required chip and antenna are disposed on the surface of the card manufacturing base material, such that a contactless card is manufactured in a more automated and standardized manner, and the labor costs for the manufacturing are reduced.

9 Claims, 4 Drawing Sheets

(51) Int. Cl.
*B23K 3/08* (2006.01)
*G06K 19/077* (2006.01)
*B23K 101/36* (2006.01)

(58) Field of Classification Search
CPC .......... G06K 19/07773; B23K 2101/40; B23K 1/0016; B23K 3/087; B23K 1/00
USPC ................................................. 235/492, 487
See application file for complete search history.

(56) References Cited

U.S. PATENT DOCUMENTS

| | | | | |
|---|---|---|---|---|
| 2006/0207985 | A1* | 9/2006 | Kaneko | B29C 65/222 219/243 |
| 2014/0076956 | A1* | 3/2014 | Lu | H05K 13/06 228/8 |
| 2019/0001426 | A1* | 1/2019 | Shim | H05K 3/3426 |
| 2020/0276663 | A1* | 9/2020 | Wang | B23K 1/0016 |

FOREIGN PATENT DOCUMENTS

| | | |
|---|---|---|
| CN | 108000909 A | 5/2018 |
| CN | 109214494 A | 1/2019 |
| CN | 109786305 A | 5/2019 |

OTHER PUBLICATIONS

Written Opinion of the International Searching Authority regarding International Application No. PCT/CN2020/073449, dated Apr. 8, 2020.
Office Action regarding Chinese Application No. 201910082321.3, dated Jun. 23, 2020.

* cited by examiner

CONTACTLESS CARD MANUFACTURING APPARATUS AND CONTACTLESS CARD MANUFACTURING METHOD

CROSS-REFERENCE TO RELATED APPLICATIONS

This application is a U.S. National Phase Application under 35 U.S.C. 371 of International Application No. PCT/CN2020/073449, filed on Jan. 21, 2020, which claims priority to Chinese Patent Application No. 201910082321.3 filed on Jan. 28, 2019. The above applications are incorporated herein by reference in their entirety.

TECHNICAL FIELD

The present invention relates to a contactless card manufacturing apparatus and a contactless card manufacturing method.

BACKGROUND

In a prior art, an operator uses various devices to mount a copper wire, a chip, or the like at corresponding positions of a card manufacturing base material to make a contactless card. Due to a low automation level of manufacturing contactless cards, higher labor costs are caused during the manufacturing process and a consistency difference exists between the produced contactless cards. As a result, an overall quality is difficult to improve, and high-quality contactless card products cannot be produced.

CONTENT OF THE PRESENT INVENTION

The technical problem to be solved in the present invention is to provide a contactless card manufacturing apparatus and a contactless card manufacturing method, so as to overcome the defect in the prior art that the low automatic manufacturing level of contactless cards results in high labor costs and low quality of the manufactured contactless cards.

The present invention solves the above-mentioned technical problem through the following technical solutions.

A contactless card manufacturing apparatus for manufacturing a contactless card, wherein the contactless card manufacturing apparatus includes:
  an antenna implantation device, wherein the antenna implantation device is used for implanting a copper wire into a card manufacturing base material;
  a chip fixing device, wherein the chip fixing device is used for placing a chip at a fixed position on the card manufacturing base material;
  a pin welding device, wherein the pin welding device is used for respectively welding a wire to a pin of the chip and to the copper wire; and
  a transmission device, wherein the transmission device is used for transmitting the card manufacturing base material among the antenna implantation device, the chip fixing device and the pin welding device.

According to the contactless card manufacturing apparatus, the card manufacturing base material is taken as a unit in the process of manufacturing a contactless card, by means of the transmission device, the card manufacturing base material is transmitted between the devices corresponding to various processing links, and the chip, the antenna and other elements are mounted to corresponding positions of the card manufacturing base material, so as to improve an automatic production level of the contactless card.

For the contactless card that requires high surface smoothness and appearance, the contactless card manufacturing apparatus reduces the labor costs of manufacturing the contactless card and effectively improves an overall quality of the produced contactless card by improving the automatic production level of the contactless card.

Preferably, the contactless card manufacturing apparatus further includes a finishing station, and the transmission device is further used for transmitting the card manufacturing base material to the finishing station, so as to facilitate collection of finished products.

Preferably, the antenna implantation device includes an antenna implantation head, an implantation end of the antenna implantation head being connected to the copper wire to implant the copper wire into the card manufacturing base material by ultrasonic embedding, so that the copper wire can be arranged around the card manufacturing base material to form an antenna.

Preferably, the chip fixing device includes a mobile chuck, the mobile chuck being used for sucking the chip from a wafer disk and placing the chip at a fixed position on the card manufacturing base material.

Compared with other manners of temporarily fixing the chip, the chuck has a soft surface and has a large surface area corresponding to a size of the chip, which can thus avoid damages to a surface of the chip when the chip is removed by the chip fixing device.

Preferably, the pin welding device includes:
  a fixing mechanism, wherein the fixing mechanism straightens the wire and fixes two ends of the wire, so that a middle part of the wire is kept on the pin of the chip;
  a solder pin, wherein the solder pin is vertically arranged and moves up and down relative to the fixing mechanism, and when the solder pin moves downwards, a tip of the solder pin is pressed on the wire and the pin;
  an auxiliary solder pin, wherein the auxiliary solder pin is vertically arranged and moves synchronously with the solder pin, and when the auxiliary solder pin moves downwards, a tip of the auxiliary solder pin is pressed on the wire and the copper wire; and
  a cutting mechanism, wherein the cutting mechanism is used for cutting off the wire.

The pin welding device fixes the two ends of the wire and straightens the wire through the fixing mechanism, so that a position of the wire can be fixed. Then, the wire abuts against the pin of the chip and the copper wire, the wire is welded to the pin and the copper wire through the solder pin and the auxiliary solder pin, and finally, the wire is cut off from a reasonable position through the cutting mechanism, to lead out the pin of the chip to the copper wire through the wire.

Preferably, the fixing mechanism includes two fixing portions, the two fixing portions being arranged on the two ends of the wire respectively, so that the fixing mechanism can implement a function of fixing the two ends of the wire.

Preferably, each of the fixing portions includes a pair of rollers, rolling surfaces of the rollers are in contact with each other, the wire is arranged between the rolling surfaces of the rollers, and the rollers of the two fixing portions roll backward to straighten the wire and fix the wire to the fixing mechanism.

In the structure, two pairs of rollers are adopted to implement the function of fixing and straightening the two ends of the wire. By controlling rotation directions and output torque of the two pairs of rollers, many functions such as straightening the wire, mounting the wire to the fixing mechanism, and dismounting the wire from the fixing mechanism can be implemented. Furthermore, by controlling the output torque of the two pairs of rollers, the wire can move left and right relative to the fixing mechanism, which facilitates adjustment of a position relationship between the wire and the fixing mechanism. Such a manner of fixing the wire has the advantages of a simple structure and firm fixation compared with other manners.

Preferably, the cutting mechanism includes a crimping knife, the crimping knife being arranged on one side of the solder pin and moving up and down relative to the fixing mechanism, and when the crimping knife moves downwards, the crimping knife cutting off the wire.

The cutting mechanism implements a function of cutting off the wire by pressing down the crimping knife. Compared with other manners of cutting off the wire, the structure in this manner is relatively simple and easy to maintain.

A contactless card manufacturing method, using the contactless card manufacturing apparatus as described above, the contactless card manufacturing method including the following steps:

S1: transmitting, by the transmission device, the card manufacturing base material to the antenna implantation device;

S2: implanting the copper wire into the card manufacturing base material through the antenna implantation device;

S3: transmitting, by the transmission device, the card manufacturing base material from the antenna implantation device to the chip fixing device;

S4: placing the chip at a fixed position on the card manufacturing base material through the chip fixing device;

S5: transmitting, by the transmission device, the card manufacturing base material from the chip fixing device to the pin welding device; and S6: welding the copper wire to the pin of the chip through the pin welding device.

According to the contactless card manufacturing method, by means of the transmission device transmitting the card manufacturing base material, the card manufacturing base material is transmitted between the devices corresponding to various processing links, and with the card manufacturing base material as a reference, a required chip and antenna are disposed on the surface of the card manufacturing base material, such that a contactless card is manufactured in a more automated and standardized manner, and production efficiency of the contactless card can be effectively improved.

Preferably, the contactless card manufacturing device further includes a finishing station; and after step S6, the transmission device transmits the card manufacturing base material from the pin welding device to the finishing station, so as to facilitate collection of the manufactured contactless card.

Preferably, the pin welding device includes:

a fixing mechanism, wherein the fixing mechanism straightens the wire and fixes the two ends of the wire, so that a middle part of the wire is kept on the pin of the chip;

a solder pin, wherein the solder pin is vertically arranged and moves up and down relative to the fixing mechanism, and when the solder pin moves downwards, a tip of the solder pin is pressed on the wire and the pin;

an auxiliary solder pin, wherein the auxiliary solder pin is vertically arranged and moves synchronously with the solder pin, and when the auxiliary solder pin moves downwards, a tip of the auxiliary solder pin is pressed on the wire and the copper wire; and a cutting mechanism, wherein the cutting mechanism is used for cutting off the wire; and step S6 includes the following steps:

S61: providing a welding material on the pin of the chip;

S62: straightening the wire and fixing the two ends of the wire through the fixing mechanism;

S63: changing a relative position of the fixing mechanism to the chip, so that the middle part of the wire abuts against the pin of the chip;

S64: abutting the tip of the solder pin against the wire and the pin, and abutting the tip of the auxiliary solder pin against the wire and the copper wire, to form two welding points, so that the wire is welded to the pin and the copper wire; and S65: cutting off any side of the wire close to the welding point through the cutting mechanism.

According to the contactless card manufacturing method, in the case where a diameter of the wire and a size of the pin of the chip are both small, the fixing mechanism fixes the two ends of the wire and straightens the wire from the two ends, so that a relative position of the wire to the fixing mechanism and the solder pin is defined. Then, the middle part of the wire is welded to the pin of the chip through the solder pin and the excess wire is cut off, so that the wire with a small diameter can also be welded to the chip through the pin welding method.

Preferably, the chip includes at least two pins, the pin welding device includes two solder pins, the two solder pins are arranged in parallel, the cutting mechanism is located between the two solder pins, and in step S3, a relative position and an angle of the fixing mechanism to the chip are changed, so that the middle part of the wire abuts against the two pins of the chip simultaneously;

in step S4, tips of the two solder pins abut against the wire and the two pins respectively to form two welding points, and the wire is welded to the two pins; and in step S5, a part of the wire located between the two welding points is cut off through the cutting mechanism.

According to the method, by changing relative angles of the fixing mechanism and the wire fixed by the fixing mechanism to the two pins of the chip, the middle part of the wire can abut against the two pins simultaneously; then, the wire is welded to the two pins through two solder pins, and the part of the wire located between the two welding points is cut off through the cutting mechanism, so that the two pins of the chip are led out by the wire at the same time. With the pin welding method, the two pins of the chip can be welded at the same time in a single operation, thereby improving welding efficiency of the pins of the chip.

The present invention has the following positive progressive effects:

according to the contactless card manufacturing apparatus and the contactless card manufacturing method, by means of the transmission device transmitting the card manufacturing base material, the card manufacturing base material is transmitted between the devices corresponding to various processing links, and with the card manufacturing base material as a reference, a required chip and antenna are disposed on the surface of the card manufacturing base material, such that a contactless card is manufactured in a more automated and standardized manner, and the labor costs for the manufacturing are reduced. For the contactless card that requires high surface smoothness and appearance, the overall quality of its output can be effectively improved.

REFERENCE NUMERALS

Antenna implantation device 1
Antenna implantation head 11
Chip fixing device 2
Mobile chuck 21
Pin welding device 3
Fixing mechanism 31
Fixing portion 311
Solder pin 32
Cutting mechanism 33
Auxiliary solder pin 34
Transmission device 4
Copper wire 61
Chip 62, pin 71
Card manufacturing base material 63
Wire 64, straightening direction a
Steps S1 to S6

DETAILED DESCRIPTION OF THE PREFERRED EMBODIMENT

The present invention is further described below by way of embodiments, and is not therefore limited to the scope of such embodiments.

Embodiment 1

As shown in FIG. 1, FIG. 2, FIG. 3 and FIG. 4, the present invention provides a contactless card manufacturing apparatus for manufacturing a contactless card. The contactless card manufacturing apparatus includes an antenna implantation device 1, a chip fixing device 2, a pin welding device 3 and a transmission device 4. The antenna implantation device 1 is used for implanting a copper wire 61 into a card manufacturing base material 63. The chip fixing device 2 is used for placing a chip 62 at a fixed position on the card manufacturing base material 63 to form an antenna of the contactless card. The pin welding device 3 is used for welding a wire 64 to a pin 71 of the chip 62 and to the copper wire 61 to connect the chip 62 with the copper wire 61. The transmission device 4 is used for transmitting the card manufacturing base material 63 among the antenna implantation device 1, the chip fixing device 2 and the pin welding device 3. Since one chip 62 generally has two pins 71 and the copper wire 61 has two access terminals after being wound as an antenna, the pin welding device 3 is required to perform two welding operations to complete the welding of the two pins 71 of the chip 62 to the copper wire 61 on two sides during manufacturing of one contactless card.

According to the contactless card manufacturing apparatus, the card manufacturing base material 63 is taken as a unit in the process of manufacturing a contactless card; by means of the transmission device 4, the card manufacturing base material 63 is transmitted between the devices corresponding to various processing links, and the chip 62, the antenna made of the copper wire 61 and other elements are mounted to corresponding positions of the card manufacturing base material 63, so as to improve the automatic production level of the contactless card.

Figure 4:
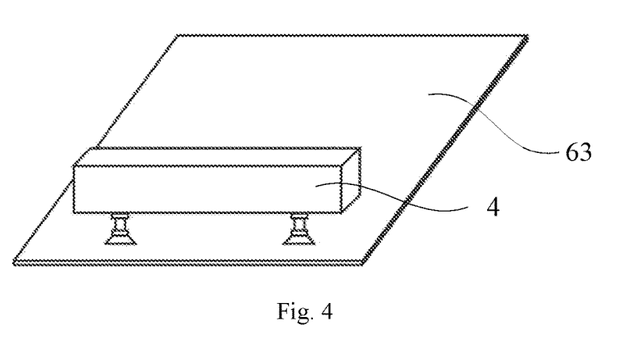
FIG. 4 is a schematic structural diagram of a transmission device of the contactless card manufacturing apparatus according to Embodiment 1 of the present invention.

The transmission device 4 of the contactless card manufacturing apparatus can carry the card manufacturing base material 63 in a variety of ways, such as by means of a horizontal conveyor belt, to enable the card manufacturing base material 63 to be transmitted among a plurality of devices, or as shown in this embodiment, carry the card manufacturing base material 63 in conjunction with a horizontal mobile device by means of a chuck sucking the card manufacturing base material 63 from thereabove.

For the contactless card that requires high surface smoothness and exquisite appearance, the contactless card manufacturing apparatus reduces the labor costs of manufacturing the contactless card and effectively improves the overall quality of the produced contactless card by improving the automatic production level of the contactless card.

The contactless card manufacturing apparatus further includes a finishing station (not shown in the drawing). The transmission device 4 can transmit the card manufacturing base material 63 to the finishing station after the corresponding elements are mounted on a surface of the card manufacturing base material 63, so as to facilitate collection of finished products.

Figure 1:
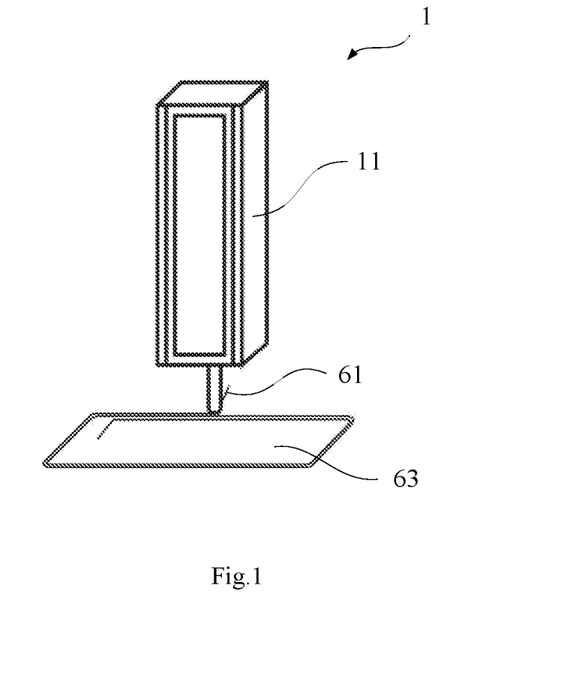
FIG. 1 is a schematic structural diagram of an antenna implantation device of a contactless card manufacturing apparatus according to Embodiment 1 of the present invention.

As shown in FIG. 1, the antenna implantation device 1 includes an antenna implantation head 11. An implantation end of the antenna implantation head 11 is connected to the copper wire 61 to implant the copper wire 61 into the card manufacturing base material 63 by ultrasonic embedding, so that the copper wire 61 can be arranged around the card manufacturing base material 63 to form an antenna.

Figure 2:
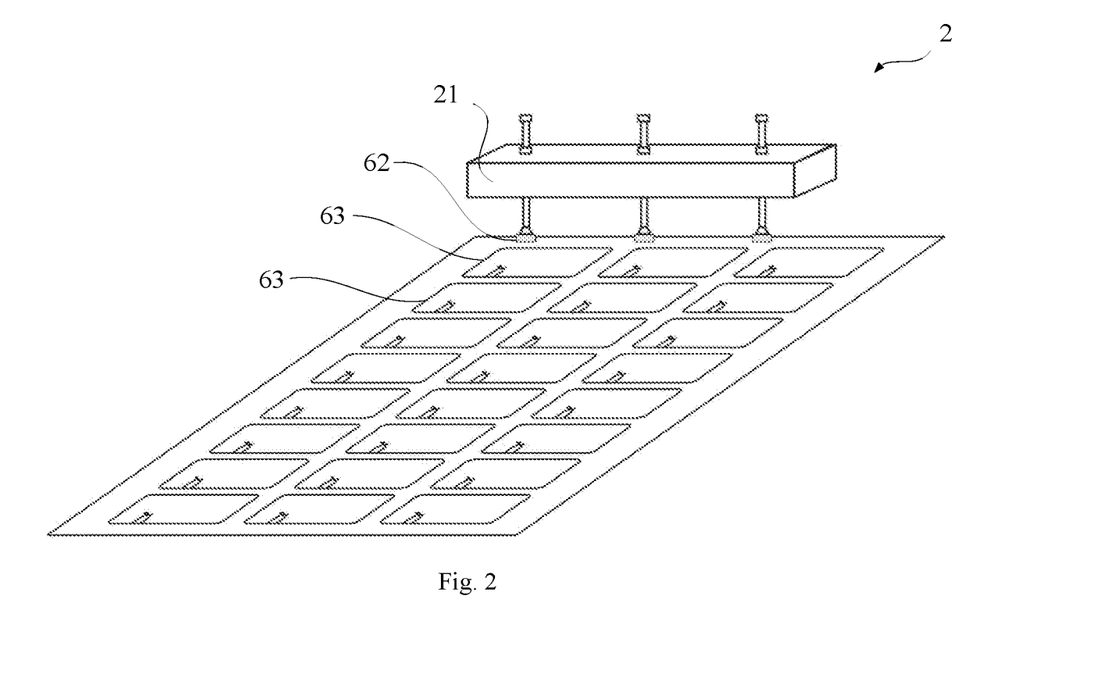
FIG. 2 is a schematic structural diagram of a chip fixing device of the contactless card manufacturing apparatus according to Embodiment 1 of the present invention.

As shown in FIG. 2, the chip fixing device 2 includes a mobile chuck 21. The mobile chuck 21 is used for sucking the chip 62 from a wafer disk and placing the chip 62 at a fixed position on the card manufacturing base material 63. Compared with other manners of temporarily fixing the chip 62, the chuck has a soft surface and has a large surface area corresponding to a size of the chip 62, which can thus avoid damages to a surface of the chip 62 when the chip 62 is removed by the chip fixing device 2. Before the chip 62 is moved from the wafer disk to the card manufacturing base material 63, the chip 62 can be fixed to a fixed position of the card manufacturing base material 63 by pre-applying an adhesive to the card manufacturing base material 63 or controlling the mobile chuck 21 to enable the sucked chip 62 to be first dipped in the adhesive and then placed on the card manufacturing base material 63.

Figure 3:
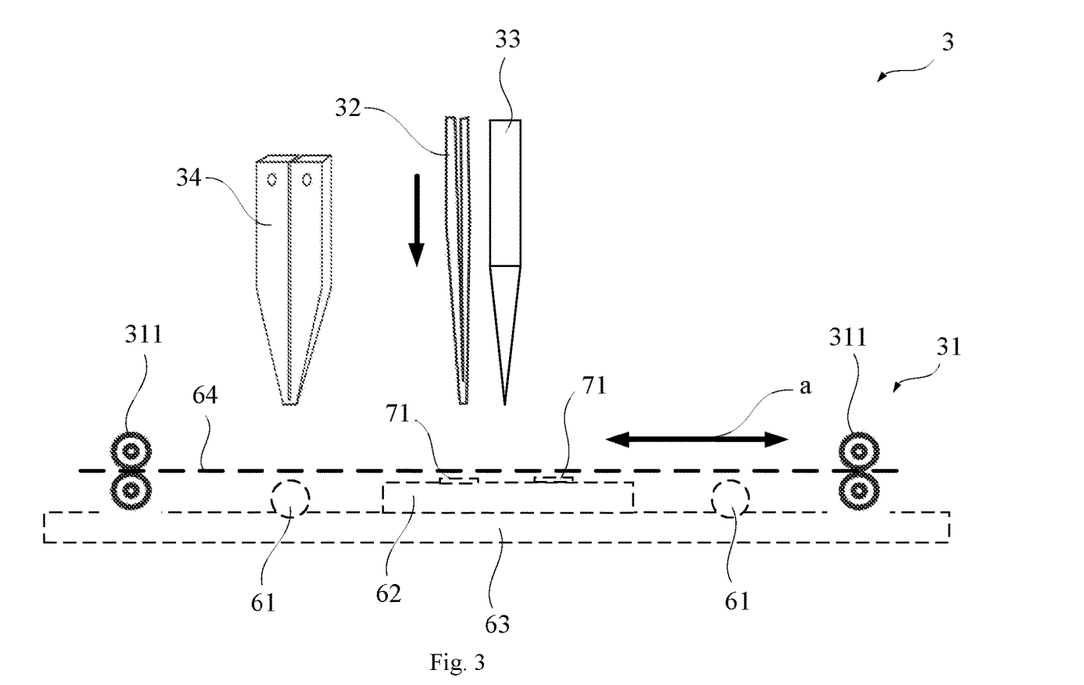
FIG. 3 is a schematic structural diagram of a pin welding device of the contactless card manufacturing apparatus according to Embodiment 1 of the present invention.

As shown in FIG. 3, the pin welding device 3 is used for welding the wire 64 to the pin 71 of the chip 62 and the access terminal of the copper wire 61, including a fixing mechanism 31, a solder pin 32, an auxiliary solder pin 34 and a cutting mechanism 33. The fixing mechanism 31 straightens the wire 64 and fixes the two ends of the wire 64, so that the wire 64 can be kept above the pin 71 of the chip 62 and the copper wire 61. The solder pin 32 is vertically arranged and can move up and down relative to the fixing mechanism 31. When the solder pin 32 moves downwards, a tip of the solder pin 32 can be pressed on the wire 64 and the pin 71, and the auxiliary solder pin 34 moves synchronously with the solder pin 32. When the auxiliary solder pin 34 moves downwards, a tip of the auxiliary solder pin 34 can be pressed on the wire 64 and the copper wire 61, and the cutting mechanism 33 is used for cutting off the wire 64 fixed by the fixing mechanism 31.

The pin welding device 3 fixes two ends of the wire 64 and straightens the wire 64 through the fixing mechanism 31, so that a position of the wire 64 can be fixed. Then, the wire 64 abuts against the pin 71 of the chip 62 and the copper wire 61, the wire 64 is welded to the pin 71 and the copper wire 61 through the solder pin 32 and the auxiliary solder pin 34, and finally, the wire 64 is cut off from a reasonable position through the cutting mechanism 33, to lead out the pin 71 of the chip 62 to the copper wire 61 through the wire 64.

In the case where a size of the pin 71 of the chip 62 and a diameter of the wire 64 are both small, the pin welding device 3 fixes two ends of the wire 64 and straightens the wire through the fixing mechanism 31, and the tip of the solder pin 32 can abut against the wire 64 when the solder pin moves only downwards. After the welding is completed, the welding between the wire 64, the pin 71 and the copper wire 61 can be realized in the case where the size of the pin 71 of the chip 62 and the diameter of the wire 64 are both small when only the wire 64 on either side of the welding point is cut off through the cutting mechanism 33, thereby reducing the welding difficulty.

The fixing mechanism 31 of the pin welding device 3 includes two fixing portions 311. The two fixing portions 311 are arranged on two ends of the wire 64 respectively, so as to implement a function of fixing the two ends of the wire 64. Each fixing portion 311 includes a pair of rollers, rolling surfaces of the pair of rollers are in contact with each other, and the wire 64 is arranged between the rolling surfaces of the rollers. The two pairs of rollers of the two fixing portions 311 roll backward to straighten the wire 64 and fix two ends of the wire to the fixing mechanism 31. In the structure, two pairs of rollers are adopted to implement the function of fixing and straightening the two ends of the wire 64. By controlling rotation directions and output torque of the two pairs of rollers, many functions such as straightening the wire 64, mounting the wire 64 to the fixing mechanism 31, and dismounting the wire from the fixing mechanism 31 can be implemented. Furthermore, by controlling the output torque of the two pairs of rollers, the wire 64 can move left and right relative to the fixing mechanism 31, which facilitates adjustment of a position relationship between the wire 64 and the fixing mechanism 31. Such a manner of fixing the wire 64 has the advantages of a simple structure and firm fixation compared with other manners.

The cutting mechanism 33 of the pin welding device 3 includes a crimping knife. The crimping knife is arranged on one side of the solder pin 32 and moves up and down relative to the fixing mechanism 31, and when the crimping knife moves downwards, a tool nose of the crimping knife abuts against the wire 64 to cut off the wire 64. The cutting mechanism 33 implements a function of cutting off the wire 64 by pressing down the crimping knife. Compared with other manners of cutting off the wire 64, the structure in this manner is relatively simple and easy to maintain.

In addition, the cutting mechanism 33 may further include a limit device (not shown in the drawing). The limit device is located below the crimping knife and arranged close to the chip 62. A top of the limit device is of a same height as an upper surface of the chip 62, so as to avoid damages of the crimping knife to the upper surface of the chip 62 when the crimping knife moves downwards.

The pin welding device 3 may further include a position adjusting mechanism (not shown in the drawing). The position adjusting mechanism is connected to the fixing mechanism 31 and the solder pin 32, and is used for adjusting positions of the fixing mechanism 31 and the solder pin 32 relative to the pin 71 of the chip 62, so that the pin welding device 3 can change a relative angle between the wire 64 and the chip 62, or the position of the solder pin 32 is adjusted to enable the solder pin to be aligned with the pin 71 of the chip 62, so that the pin welding device 3 can weld the chip 62 at the position of the pin 71 with different specifications and sizes, so as to improve usage compatibility of the pin welding device 3. The position adjusting mechanism may be a mobile platform or a mobile manipulator, and both are prior arts or mechanical structures. The position adjusting mechanism is connected to the fixing mechanism 31 and the solder pin 32 to adjust horizontal positions of the fixing mechanism 31 and the solder pin 32 in front, back, left and right directions and a rotation angle with a height direction as an axis, so as to change relative positions of the fixing mechanism 31 and the solder pin 32 to the chip 62.

Figure 5:
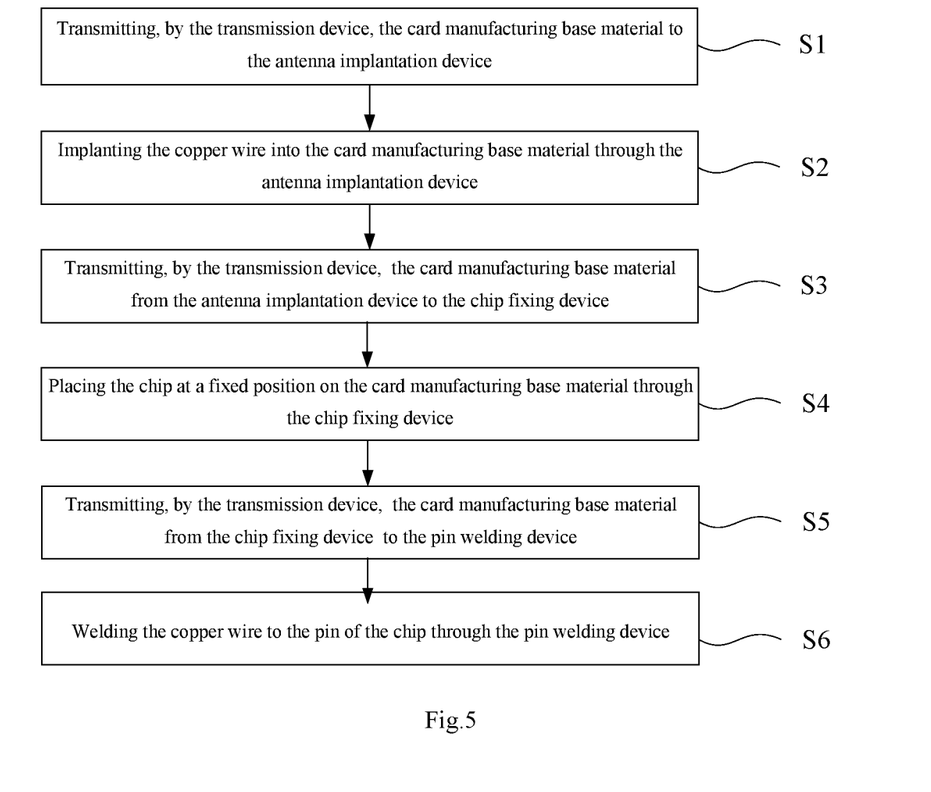
FIG. 5 is a schematic flowchart of a contactless card manufacturing method according to Embodiment 1 of the present invention.

As shown in FIG. 5, the present invention further provides a contactless card manufacturing method, using the contactless card manufacturing apparatus as described above. The contactless card manufacturing method includes the following steps.

In S1, the transmission device 4 transmits the card manufacturing base material 63 to the antenna implantation device 1.

In S2, the copper wire 61 is implanted into the card manufacturing base material 63 through the antenna implantation device 1.

In S3, the transmission device 4 transmits the card manufacturing base material 63 from the antenna implantation device 1 to the chip fixing device 2.

In S4, the chip 62 is placed at a fixed position on the card manufacturing base material 63 through the chip fixing device 2.

In S5, the transmission device 4 transmits the card manufacturing base material 63 from the chip fixing device 2 to the pin welding device 3.

In S6, the copper wire 61 is welded to the pin 71 of the chip 62 through the pin welding device 3.

According to the contactless card manufacturing method, by means of the transmission device 4 transmitting the card manufacturing base material 63, the card manufacturing base material 63 is transmitted between the devices corresponding to various processing links, and with the card manufacturing base material 63 as a reference, a required chip 62 and antenna are disposed on the surface of the card manufacturing base material, such that a contactless card is manufactured in a more automated and standardized manner, and production efficiency of the contactless card can be effectively improved.

In addition, upon completion of step S6, the card manufacturing base material 63 may also be transmitted by the transmission device 4 from the pin welding device 3 to the finishing station, so as to facilitate collection of the manufactured contactless card.

Step S6 may include the following specific steps.

In S61, a welding material is provided on the pin 71 of the chip 62.

In S62, the wire 64 is straightened and the two ends of the wire 64 are fixed through the fixing mechanism 31.

In S63, a relative position of the fixing mechanism 31 to the chip 62 is changed so that the middle part of the wire 64 abuts against the pin 71 of the chip 62.

In S64, the tip of the solder pin 32 abuts against the wire 64 and the pin 71, and the tip of the auxiliary solder pin 34 abuts against the wire 64 and the copper wire 61, to form two welding points, so that the wire 64 is welded to the pin 71 and the copper wire 61.

In S65, any side of the wire 64 close to the welding point is cut off through the cutting mechanism 33.

According to the welding method of the pin 71, in the case where a diameter of the wire 64 and a size of the pin 71 of the chip 62 are both small, the fixing mechanism 31 fixes the two ends of the wire 64 and straightens the wire 64 from the two ends, so that a relative position of the wire 64 to the fixing mechanism 31 and the solder pin 32 is defined. Then, the middle part of the wire 64 is welded to the pin 71 of the chip 62 through the solder pin 32 and the excess wire 64 is cut off, so that the wire 64 with a small diameter can also be welded to the chip 62 through the welding method of the pin 71.

Embodiment 2

Figure 6:
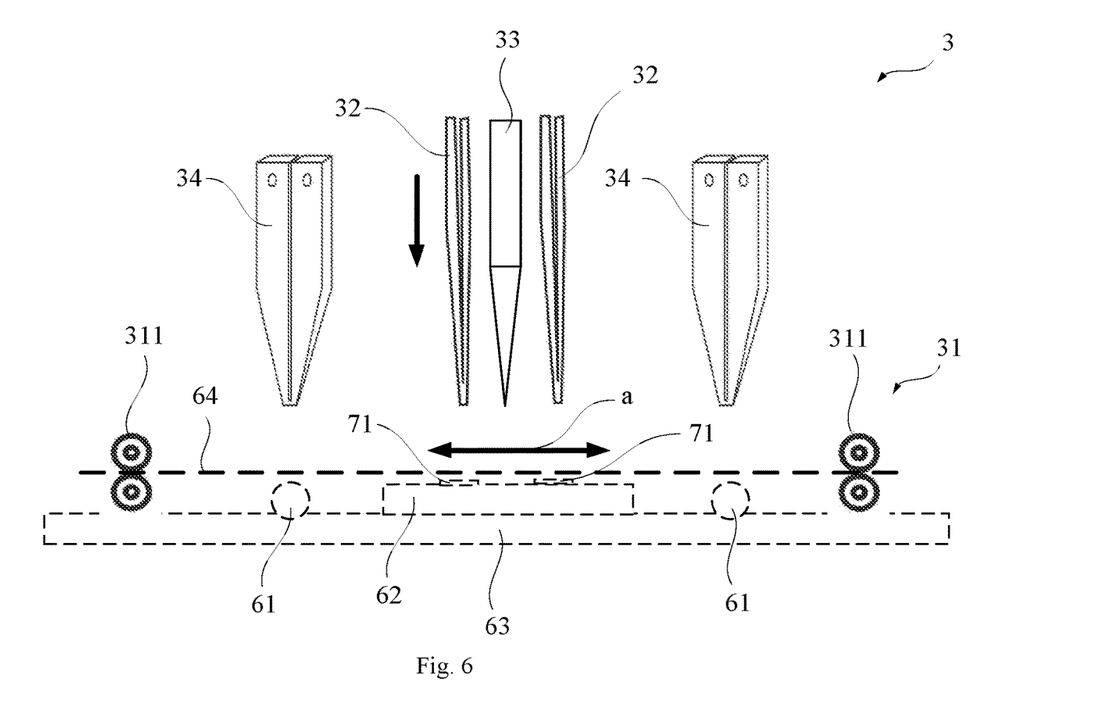
FIG. 6 is a schematic structural diagram of a pin welding device of a contactless card manufacturing apparatus according to Embodiment 2 of the present invention.

As shown in FIG. 6, this embodiment further provides a contactless card manufacturing apparatus, which has a structure substantially the same as the contactless card manufacturing apparatus according to Embodiment 1. A difference lies in that in this embodiment, the pin welding device 3 of the contactless card manufacturing apparatus includes two solder pins 32. The two solder pins 32 are arranged in parallel, and the cutting mechanism 33 is located between the two solder pins 32. The pin welding device 3 may be applied to a case where the chip 62 has more than two pins 71, the wire 64 can be welded to the two pins 71 at the same time, and the two pins 71 are led out through the wire 64 simultaneously. Specifically, the pin welding device 3 is provided with two solder pins 32, and the two solder pins 32 can be configured to weld the wire 64 straightened and fixed by the fixing mechanism 31 to the two pins 71 of the chip 62 at the same time, and the cutting mechanism 33 is located between the two solder pins 32, so as to cut off a part of the wire 64 between two welding points formed after the wire 64 is welded, so that the two pins 71 of the chip 62 can be led out through the wire 64 fixed thereto by welding respectively.

In addition, the pin welding device 3 is further provided with two auxiliary solder pins 34 corresponding to the solder pins 32. The two auxiliary solder pins 34 are arranged on left and right sides of the solder pins 32 along a straightening direction a of the wire 64 and move up and down synchronously with the two solder pins 32. The auxiliary solder pin 34 moves up and down synchronously with the solder pin 32, and when the wire is welded to the pin 71 by the solder pin 32, the wire 64 is welded to the copper wire 61 on two sides of the chip 62 by the two auxiliary solder pins 34 at the same time, so that the two pins 71 of the chip 62 can be connected to the copper wire 61 on the two sides at the same time. Then, the pin welding device 3 of the contactless card manufacturing apparatus is required to perform welding only once to enable the two pins 71 of the chip 62 of the contactless card to be connected to the copper wire 61.

This embodiment further provides a contactless card manufacturing method, which is substantially the same as the contactless card manufacturing method according to Embodiment 1. A difference lies in that according to the contactless card manufacturing method, the pin welding device 3 is required to perform welding only once to enable the two pins 71 of the chip 62 to be connected to the copper wire 61 at the same time.

In step S63 of the contactless card manufacturing method, the middle part of the wire 64 abuts against the two pins 71 of the chip 62 at the same time by changing a relative position and angle of the fixing mechanism 31 to the chip 62. In step S4, tips of the two solder pins 32 abut against the wire 64 and the two pins 71, and tips of the two auxiliary solder pins 34 abut against the copper wire 61 on two sides of the chip 62 respectively to form two welding points respectively, so that the wire 64 is welded to the two pins 71 and the copper wire 61 on the two sides. In step S65, the part of the wire 64 located between the two welding points is cut off through the cutting mechanism 33. According to the method, by changing relative angles of the fixing mechanism 31 and the wire 64 fixed by the fixing mechanism to the two pins 71 of the chip 62, the middle part of the wire 64 can abut against the two pins 71 simultaneously; then, the wire 64 is welded to the two pins 71 through two solder pins 32, and the part of the wire 64 located between the two welding points is cut off through the cutting mechanism 33, so that the two pins 71 of the chip 62 are led out by the wire 64 at the same time. With the welding method of the pin 71, the two pins 71 of the chip 62 can be welded at the same time in a single operation, thereby improving the welding efficiency of the chip 62.

In this embodiment, the welding method of the pin welding device 3 and the pin 71 can be adapted to a function of welding the chip 62 with the pin 71 at different pitches by adjusting and fixing a relative distance between the two solder pins 32, which improves versatility of the contactless card manufacturing apparatus and the contactless card manufacturing method, so that the contactless card manufacturing apparatus, even in the case of contactless cards with a variety of different specifications in the process of manufacturing the contactless cards, can deal with them by changing a mechanical position without human participation, thereby improving the automation level of the contactless card manufacturing apparatus.

In the description of the present invention, it should be understood that the orientation or position relationship indicated by the terms "upper", "lower", "front", "back", "left", "right", "vertical", "horizontal", "top", "bottom", "inner", "outer", etc. are based on the orientation or position relationship shown in the accompanying drawings and are intended to facilitate the description of the present application and simplify the description only, rather than indicating or implying that the device or element referred to must have a particular orientation or be constructed and operated in a particular orientation, and therefore are not to be interpreted as limiting the present invention.

Although specific implementations of the present invention are described above, it should be appreciated by those skilled in the art that these are only examples, and a variety of variations or modifications may be made to these implementations without departing from the principle and essence of the present invention. Therefore, the protection scope of the present invention is defined the appended claims.

What is claimed is:

1. A contactless card manufacturing apparatus for manufacturing a contactless card, wherein the contactless card manufacturing apparatus comprises:
   an antenna implantation device, wherein the antenna implantation device is used for implanting a copper wire into a card manufacturing base material;
   a chip fixing device, wherein the chip fixing device is used for placing a chip at a fixed position on the card manufacturing base material;
   a pin welding device, wherein the pin welding device is used for welding two ends of a wire to a pin of the chip and to the copper wire respectively; and
   a transmission device, wherein the transmission device is used for transmitting the card manufacturing base material among the antenna implantation device, the chip fixing device and the pin welding device, wherein the pin welding device comprises:
   a fixing mechanism, wherein the fixing mechanism straightens the wire and fixes the two ends of the wire, so that a middle part of the wire is kept on the pin of the chip;
   a solder pin; and
   a cutting mechanism, wherein the cutting mechanism is used for cutting off the wire,
   the cutting mechanism comprising a crimping knife arranged on one side of the solder pin of the pin welding device and moving up and down relative to the fixing mechanism, and when the crimping knife moves downwards, the crimping knife cutting off the wire,
   the cutting mechanism further comprising a limit device, which is located below the crimping knife and arranged close to the chip, and a top of the limit device is of a same height as an upper surface of the chip.

2. The contactless card manufacturing apparatus according to claim 1, wherein the contactless card manufacturing apparatus further comprises a finishing station, and the transmission device is further used for transmitting the card manufacturing base material to the finishing station.

3. The contactless card manufacturing apparatus according to claim 1, wherein the antenna implantation device comprises an antenna implantation head, an implantation end of the antenna implantation head is connected to the copper wire and implants the copper wire into the card manufacturing base material by ultrasonic embedding.

4. The contactless card manufacturing apparatus according to claim 1, wherein the chip fixing device comprises a mobile chuck used for sucking the chip from a wafer disk and placing the chip at a fixed position on the card manufacturing base material.

5. The contactless card manufacturing apparatus according to claim 1, wherein
   the solder pin is vertically arranged and moves up and down relative to the fixing mechanism, and when the solder pin moves downwards, a tip of the solder pin is pressed on the wire and the pin, wherein
   the pin welding device comprises an auxiliary solder pin, wherein the auxiliary solder pin is vertically arranged and moves synchronously with the solder pin, and when the auxiliary solder pin moves downwards, a tip of the auxiliary solder pin is pressed on the wire and the copper wire.

6. The contactless card manufacturing apparatus according to claim 5, wherein the fixing mechanism comprises two fixing portions arranged on two ends of the wire, respectively.

7. A contactless card manufacturing method for manufacturing a contactless card, comprising: providing a contactless card manufacturing apparatus including: an antenna implantation device, wherein the antenna implantation device is used for implanting a copper wire into a card manufacturing base material; a chip fixing device, wherein the chip fixing device is used for placing a chip at a fixed position on the card manufacturing base material; a pin welding device, wherein the pin welding device is used for welding two ends of a wire to a pin of the chip and to the copper wire respectively; and a transmission device, wherein the transmission device is used for transmitting the card manufacturing base material among the antenna implantation device, the chip fixing device and the pin welding device, wherein the pin welding device comprises: a fixing mechanism, wherein the fixing mechanism straightens the wire and fixes the two ends of the wire, so that a middle part of the wire is kept on the pin of the chip; a solder pin; and a cutting mechanism, wherein the cutting mechanism is used for cutting off the wire, the cutting mechanism comprising a crimping knife arranged on one side of the solder pin of the pin welding device and moving up and down relative to the fixing mechanism, and when the crimping knife moves downwards, the crimping knife cutting off the wire, the cutting mechanism further comprising a limit device, which is located below the crimping knife and arranged close to the chip, and a top of the limit device is of a same height as an upper surface of the chip; wherein the contactless car manufacturing method comprising the following steps:
   S1: transmitting, by the transmission device, the card manufacturing base material to the antenna implantation device;
   S2: implanting the copper wire into the card manufacturing base material through the antenna implantation device;
   S3: transmitting, by the transmission device, the card manufacturing base material from the antenna implantation device to the chip fixing device;
   S4: placing the chip at a fixed position on the card manufacturing base material through the chip fixing device;
   S5: transmitting, by the transmission device, the card manufacturing base material from the chip fixing device to the pin welding device; and
   S6: welding the copper wire to the pin of the chip through the pin welding device.

8. The contactless card manufacturing method according to claim 7, wherein the contactless card manufacturing apparatus further comprises a finishing station; and
   after step S6, the transmission device transmits the card manufacturing base material from the pin welding device to the finishing station.

9. The contactless card manufacturing method according to claim 7, wherein
   the solder pin is vertically arranged and moves up and down relative to the fixing mechanism, and when the solder pin moves downwards, a tip of the solder pin is pressed on the wire and the pin, wherein
   the pin welding device comprises an auxiliary solder pin, wherein the auxiliary solder pin is vertically arranged and moves synchronously with the solder pin, and when the auxiliary solder pin moves downwards, a tip of the auxiliary solder pin is pressed on the wire and the copper wire; and a cutting mechanism, wherein the cutting mechanism is used for cutting off the wire; and step S6 comprises the following steps:

S61: providing a welding material on the pin of the chip;

S62: straightening the wire and fixing the two ends of the wire through the fixing mechanism;

S63: changing a relative position of the fixing mechanism to the chip so that the middle part of the wire abuts against the pin of the chip;

S64: abutting the tip of the solder pin against the wire and the pin and abutting the tip of the auxiliary solder pin against the wire and the copper wire to form two welding points, so that the wire is welded to the pin and the copper wire; and S65: cutting off any side of the wire close to the welding point through the cutting mechanism.

\* \* \* \* \*